United States Patent [19]

Bodig et al.

[11] Patent Number: 4,755,694
[45] Date of Patent: Jul. 5, 1988

[54] INTEGRATED CIRCUIT DARLINGTON TRANSISTOR POWER STAGE INCORPORATING VARIOUS CIRCUIT COMPONENTS INTEGRATED ON THE SAME SUBSTRATE

[75] Inventors: Bernd Bodig, Leinfelden-Echterdingen; Lothar Gademann, Rottenburg; Gerd Höhne, Ludwigsburg; Hartmut Michel, Reutlingen, all of Fed. Rep. of Germany

[73] Assignee: Robert Bosch GmbH, Stuttgart, Fed. Rep. of Germany

[21] Appl. No.: 70,098

[22] Filed: Jul. 1, 1987

Related U.S. Application Data

[63] Continuation of Ser. No. 768,967, Aug. 23, 1985, abandoned.

[30] Foreign Application Priority Data

Aug. 29, 1984 [DE] Fed. Rep. of Germany ....... 3431676

[51] Int. Cl.[4] .................. H03K 23/08; H03K 3/26; H03K 5/08
[52] U.S. Cl. .................. 307/315; 307/270; 307/310; 307/540; 357/46
[58] Field of Search ............... 307/315, 310, 270, 318, 307/540, 546, 547, 549

[56] References Cited

U.S. PATENT DOCUMENTS

| | | | |
|---|---|---|---|
| 3,436,563 | 4/1969 | Regitz | 307/315 |
| 3,629,623 | 12/1971 | Sakarai | 307/315 |
| 4,539,492 | 9/1985 | Michel et al. | 307/315 |
| 4,546,370 | 10/1985 | Curran | 357/43 |
| 4,564,771 | 1/1986 | Flohrs | 307/315 |
| 4,599,638 | 7/1986 | Flohrs | 357/51 |
| 4,618,875 | 10/1986 | Flohrs | 357/46 |

FOREIGN PATENT DOCUMENTS 3122249 12/1982 Fed. Rep. of Germany .

Primary Examiner—Stanley D. Miller
Assistant Examiner—B. P. Davis
Attorney, Agent, or Firm—Frishauf, Holtz, Goodman & Woodward

[57] ABSTRACT

An integrated anode power stage using one or more Darlington transistors combinations is constituted for currents exceeding 5 amperes and voltages exceeding 200 volts. On a common semiconductor substrate there are provided, in addition to the Darlington circuit or circuits a large number of peripheral components, both active and passive, such as are required for protection, regulation and turning on or off of the final stage for operating an ignition coil in a motor vehicle. By providing these components in basins of the same conductivity type as the base of the power transistor a unit is provided that is economical to make as well as compact and reliable.

5 Claims, 4 Drawing Sheets

INTEGRATED CIRCUIT DARLINGTON TRANSISTOR POWER STAGE INCORPORATING VARIOUS CIRCUIT COMPONENTS INTEGRATED ON THE SAME SUBSTRATE

This application is a continuation of application Ser. No. 768,967, filed Aug. 23, 1985, now abandoned.

This invention concerns an integrated circuit power stage for currents greater than about 5 amperes and voltages greater than about 200 volts including at least one planar power transistor for which the semiconductor substrate provides the collector portion and basins of the conductivity type opposite to that of the substrate are diffused into the substrate, one of which provides the base of the power transistor.

Darlington transistor circuits are already known for power transistor stages of the kind above mentioned, and they have been used for activating ignition coils in motor vehicles as well as for other purposes. A Darlington transistor circuit constituted as a monolithically integrated semi-conductor circuit is known from German published patent application (OS) 32 27 536. The transistors of this known transistor circuit are monolithically integrated in a common substrate by the use of planar transistor technology. The substrate provides the collector zones of both transistors of the Darlington combination. This integrated semiconductor circuit includes, in addition to both transistors, merely a voltage divider by which the potential of a cover electrode is determined. Peripheral circuit components serving protection, regulation or activation functions must be connected with this power stage as external circuit elements.

SUMMARY OF THE INVENTION

It is an object of the present invention to provide a power stage integrated circuit of a higher degree of integration in which peripheral circuit components can be brought into the same common substrate.

Briefly, In a monolithically integrated power stage with an inductive load and utilizing a Darlington transistor combination including an input driver transistor and a power transistor, the driver transistor has its base connected to a input terminal of the power stage while the emitter-collector path of the power transistor is connected in series with the inductive load, and the circuit further comprises a current-limiting transistor and a voltage divider composed of resistors of different temperature coefficients of resistance, connected between a point of fixed potential and the emitter of the driver transistor, and having a tap connected to the control electrode of the current-limiting transistor. The collector and emitter of the latter are connected for regulating base-emitter current flowing in the driver transistor and doing so in a manner dependent on the voltage at the tap of the voltage divider.

This monolithically integrated power stage can be made by providing basins of the same conductivity type as the base of the power transistor by diffusion into the common substrate and by further processing in these basins peripheral circuit components for the power stage, such as the current limiting transistor and the voltage divider are established in these additional basins.

The invention has the advantage of saving many manufacturing steps in producing the complete final stage. By integration in a common substrate, unitary temperature conditions are obtained for the entire circuit, as the result of which, for example, temperature compensation of temperature dependent circuit components can be carried out to an unusual degree of precision. The peripheral circuit components are diffused into additional basins in the semiconductor substrate. These peripheral components can be active components and/or passive components. For calibrating or balancing resistors, Zener diode paths can be short-circuited or shunted by alloying a spot or a strip through a high-resistant junction.

A power stage can thus be provided as the final stage of an ignition system having a Darlington circuit with at least one driver transistor and one power transistor, the collectors of which provide current for an ignition coil and the final stages controllable over an input terminal connected to the base of the driver transistor.

The two resistances of the voltage divider are preferably produced by ion implantation and are provided with a variably high doping, so that different temperature coefficients result for the two voltage divider resistance values.

BRIEF DESCRIPTION OF THE DRAWINGS

The is further described by way of illustrative example with reference to the annexed drawings, in which.

DESCRIPTION OF THE ILLUSTRATED EMBODIMENTS

Figure 1:
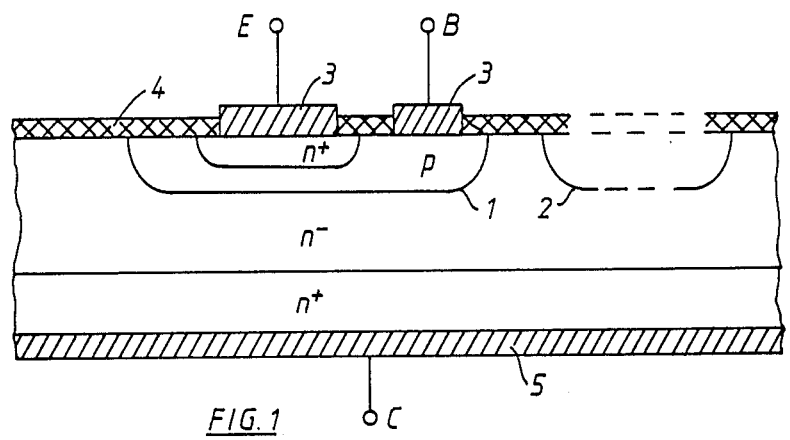
FIG. 1 is a section through an integrated circuit power stage having at least one supplementary diffused basin for the accommodation of peripheral circuit elements.

FIG. 1 shows a section of a monolithic integrated semiconductor circuit. The semiconductor wafer consists n type silicon into which two p-type basins 1 and 2 have been diffused. The p basin 1 is part of the power stage proper, while the p basin 2 is provided for peripheral circuit components. Metalization 3 is shown in FIG. 1 for the emitter connection and the base connection of a power transistor. The remaining surface of the illustrated semiconductor circuit unit is covered with an insulation layer 4 consisting of silicon dioxide, while the underside is provided with metalization 5 for connection to the collector C.

Figure 2:
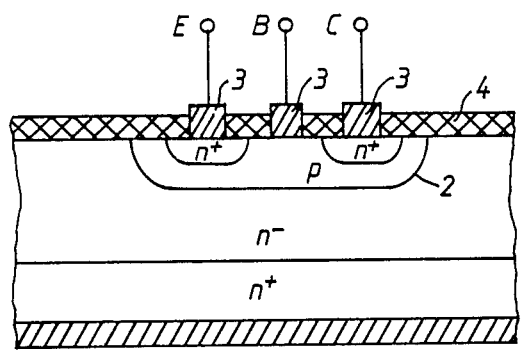
FIG. 2 shows a cross-section of the power stage in the region of a peripheral bipolar lateral transistor.

The example of peripheral circuitry illustrated in FIG. 2 concerns a bipolar lateral transistor. In this case n+ regions are diffused into the p basin 2 for the emitter E and the collector C. Metalization located between these two regions serves as a connection for the base B of the lateral transistor.

Figure 3:
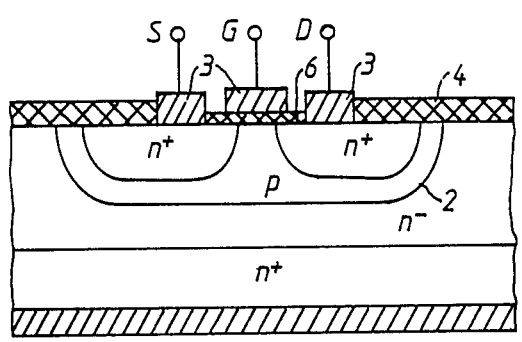
FIG. 3 is a cross-section in the region of a peripheral lateral MOS-transistor (n-channel)

The peripheral component shown in FIG. 3 is a lateral MOS-transistor constituted as an n-channel transistor. The construction of this transistor is distinguished essentially by the disposition of the control electrode, of which the metalization is applied on top of a thin oxide layer 6. The connections F, G and D are the source, gate and drain connections.

Figure 4:
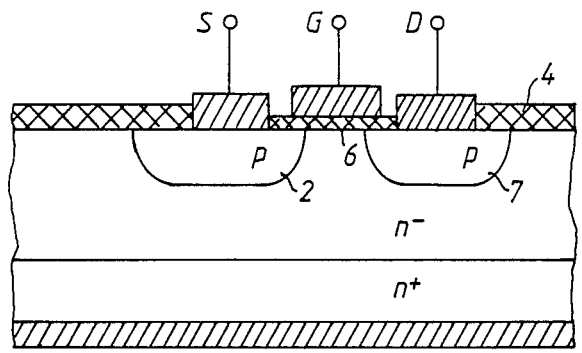
FIG. 4 is a cross-section in the region of a peripheral p-channel lateral MOS-transistor.
Figure 5:
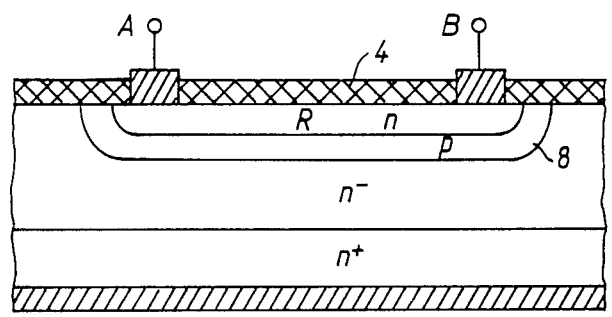
FIG. 5 is a section in the region of a peripheral resistance provided for voltages that are greater than the collector voltage of the final power stage.
Figure 6:
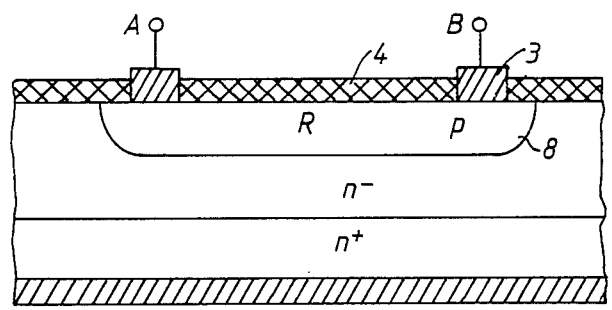
FIG. 6 is a cross-section in the region of a peripheral resistance for voltages that are smaller than the colector voltage of the final stage.

FIG. 4 shows the section of a corresponding lateral MOS-transistor which in this case is constituted as a p-channel transistor. For this purpose, two p basins 2,7 are provided. In order to make an ohmic resistance R an n-zone is diffused into a p basin 8 as shown in FIG. 5. This n zone constitutes the resistance R and extends between two connections A and B. This resistance R is suitable for voltages that are greater than the collector voltage of the associated final power stage. For voltages that are smaller than the collector voltage of the final power stage, the resistance R is constituted in a manner shown in FIG. 6. There the p basin 8 directly constitutes the resistance R.

Figure 7:
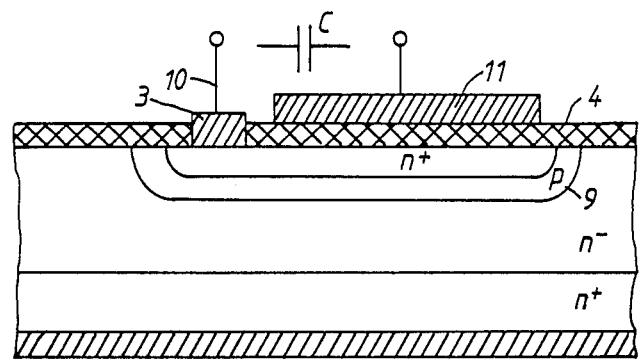
FIG. 7 is a cross-section of a peripheral MOS capacitance.

FIG. 7 shows the provision of a MOS capacitance in a region of a p basin 9. For this purpose, an $n^+$ zone is diffused into the p basin 9 and connected with a first connection 10. The second terminal of the capacitor is connected with a metalization layer 11 which is disposed at a spacing above the previously mentioned $n^+$ zone. The spacing is determined by the thickness of an interposed insulation layer 4.

Figure 8:
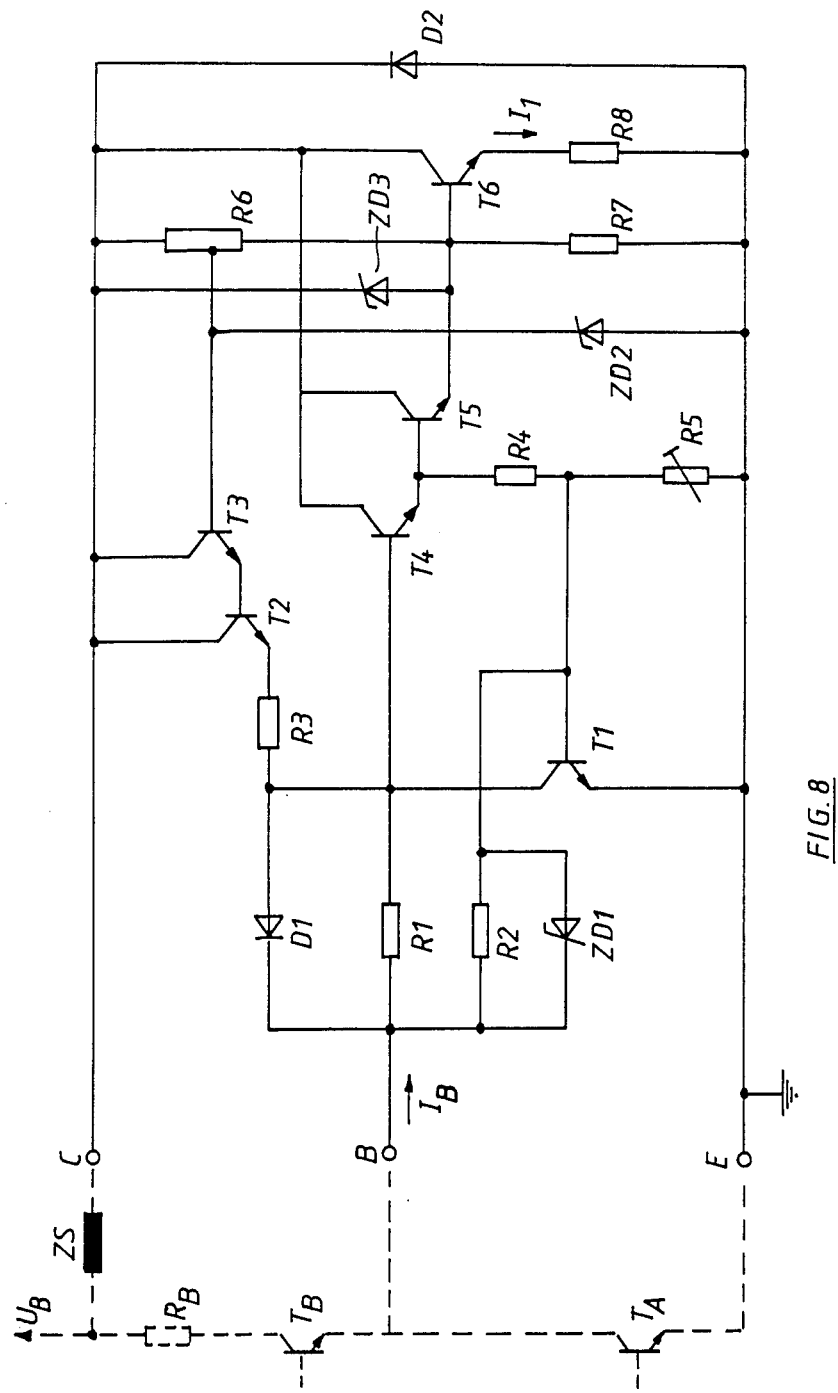
FIG. 8 is a circuit diagram of a power transistor stage according to the invention, with temperature stabilized current limiting and further peripheral circuit components.

The circuit shown in FIG. 8 includes a multiplicity of peripheral circuit elements which are integrated together with a final power stage on a common semiconductor substrate. The power stage can for example be designed for an output current of about 5 amperes and an output voltage of about 200 volts. It is, however, also possible to provide such stages in this manner for substantially higher currents and higher voltages.

Three transistors T1, T2, and T3 are provided peripheral transistors, T1 serving as current limiter, being constituted as an npn lateral transistor which can have its emitter and collector structure brought into a p basin in the same operation as the provision of the emitter of the power transistor T6.

The collector of the transistor T1 is connected with the base of a driver transistor T4 and with a base input series resistor R1. The resistor R1 has a diode D1 connected in parallel across it, with its anode connected to the base of the driver transistor T4 which is constituted as an npn transistor. The integrated circuit is the final stage of an ignition system for a motor vehicle. The input terminal B is connected through the series resistance 1 to the base of the driver transistor T4. The driver transistor T4 forms, together with the following transistors T5 and T6 a final power stage Darlington circuit.

In order to provide temperature stabilization of the current limiting, a voltage divider consisting of two resistances R4 and R5 is connected between the emitter of the driver transistor T4 and the grounded terminal E. The resistance R5 is constituted as an adjustable or trimmable resistance. Still another resistance R8 is provided for current regulation. The resistances R4, R5 and R8 serving for current regulation are constituted as integrated resistors produced by ion implantation and are preferably doped through different levels in the implantation, so that different temperature coefficients referring to their resistance values result. With pre-measurement it is possible to provide trimming the resistance R5 to a desired value. It is so formed in the semiconductor structure that connections can be changed by externally applied means as are described, for example, in German published patent application (OS) 32 01 545.

The different doping of the resistances R4 and R5 maintains the voltage appearing at the tap of the voltage divider at the proper value over a desired range of temperature. In this manner the current flowing through the transistor T1 can be regulated so that the base current flowing into the base of the driver transistor T4 and thereby the current $I_1$ flowing through a connected ignition coil ZS can be limited or regulated to a desired extent.

A first Zener diode ZD1 is provided between the connection terminal B and the base of the transistor T1 serving as current limiter for the purpose of shutting off the final stage in the case of an over-voltage. The Zener voltage can be so chosen that for a battery voltage $U_B$ greater than about 20 volts, the transistor T1 becomes conducting and thereby blocks the final power stage of the ignition system. A resistance R2 connected in parallel with the Zener diode ZD1 and provides a negative feedback path for the battery voltage in the current regulation circuit. This resistance R2 and also the resistance R1 are constituted of n-type material which is introduced into p basin. The resistance R1 can be introduced as thin n stripes in the p type base material along with the emitter diffusion.

Not yet described are peripheral circuit elements for a spark-free quiescent-state current shut-off of the ignition power stage. The transistors T2 and T3 and a second Zener diode ZD2, as well as the two resistances R3 and R6 are provided for this purpose. In normal operation the transistor $T_B$ should block and the same time the transistor $T_A$ should become conducting at the instant of ignition. The transistors $T_A$ and $T_B$ are provided as external transistors and are connected through a resistance $R_B$ with the battery voltage and with the ignition coil. Since these components are outside of the integrated circuit, their connections are shown in broken lines in FIG. 8. $T_B$ and $T_A$ should block simultaneously in a shut-off of quiescent current.

Since in quiescent current shut-off the transistor $T_A$ is blocked, the control current flowing through the transistors T3 and T2 and the resistance R3 cannot flow through the diode D1 to ground so that the driver transistor D4 and accordingly the power stage itself can be turned on by a primary voltage of for example 35 volts limited by the voltage divider R6. The secondary voltage of the ignition coil ZS thus remains at a low value insufficient for resulting in an ignition spark. The Zener diode ZD2 limits the current through the transistors T3 and T2 and the resistance R3 when the transistor $T_A$ is conducting and the voltage is substantially greater than 35 volts.

A third Zener diode ZD3 serves for voltage limiting in normal operation. For example, a clamp voltage of 350 volts can be set by this component. In addition an inverse diode D2 can be provided at the output of the Darlington circuit.

When the final ignition stage is turned on, that is, when a current $I_1$ flows through the ignition coil ZS, the transistor $T_B$ is open and the transistor $T_A$ is blocked. For producing the ignition spark the transistor $T_B$ is blocked and the transistor $T_A$ conducts, while a current can flow to ground over the diode D1 from the base of the transistor T4, thus making possible a more rapid shutting off of the final stage. Without the diode D1 the resistance R1, which can for example have a reistance value of 100 ohms, works against a rapid shut down.

The power transistor T6 is connected with the grounded resistance R8 which can also be designated as the current sensing resistor. The power transistor T6 and the resistance R8 can advantageously be constituted as a parallel connection of a number of individual transistors that are stabilized one against the other by a corresponding number of emitter series resistors.

By monolithic integration the above mentioned characteristics and functional elements can be constituted all in a single unitary component. In that way a minimization of the unit size, high reliability obtained by omission of supplementary components that might otherwise be required and cost effective manufacture are all possible. The semiconductor integrated circuit can for example be disposed in a casing such as is usual for power transistors. External circuits for current limiting are no longer necessary.

We claim:

1. Monolithically integrated power stage for switching of an inductive load (ZS), said power stage having an input terminal (B) and comprising a Darlington transistor combination including driver transistor (T4) having an emitter, a collector and a base and a power transistor (T6) having an emitter, a collector and a switched emitter-collector path, as well a base for control of said path, the driver transistor (T4) having its base connected to said input terminal (B) of said power stage and the emitter-collector path of the power transistor (T6) being connected in series with said inductive load (ZS); said power stage further comprising a current limiting transistor T1 having a base, a collector and an emitter and a first voltage divider consisting of a first (R4) and a second ohmic resistance (R5) of different temperature coefficients of resistance, said voltage divider (R4, R5) being connected between a point of fixed potential (E) and the emitter of said driver transistor (T4) and having a tap (R4, R5) connected to the base of said current limiting transistor (T1), the collector of said current-limiting transistor being connected to the base of said driver transistor (T4) and the emitter of said current-limiting transistor being connected to said point of fixed potential (E).

2. Monolithically integrated power stage for switching of an inductive load (ZS) constituted by an ignition coil of an internal combustion engine, said power stage having an input terminal (B) and comprising a Darlington transistor combination including a driver transistor (T4) having an emitter, a collector and a base and a power transistor (T6) having an emitter, a collector and a base, an emitter-collector path, a base-collector path an a base-emitter path, the driver transistor (T4) having its base connected to said input terminal (B) of said power stage and the emitter-collector path of the power transistor (T6) being connected in series with said inductive load (ZS); said power stage further comprising a control transistor device (T2, T3) having a control base electrode, a collector electrode and an emitter output electrode, said collector electrode being connected to said collector of said power transistor (T6) and said emitter output electrode being connected to said base of said driver transistor (T4), said power stage further comprising a voltage divider (R6) having a tap and having its ends connected for placing said voltage divider (R6) in parallel to said base-collector path of said power transistor (T6), said tap being connected to said control base electrode of said control transistor device (T2, T3) and also to a Zener diode (ZD2) connected between said tap and the emitter of said power transistor (T6).

3. Power stage according to claim 2, wherein an emitter series resistance (R3) is connected between said emitter output electrode of said control transistor device (T2, T3) and the base of said driver transistor.

4. Power stage according to claim 2, wherein said control transistor device (T2, T3) is a Darlington transistor combination.

5. Power stage according to claim 3, wherein said control transistor device (T2, T3) is a Darlington transistor combination.

* * * * *